United States Patent [19]

Park

[11] Patent Number: 5,773,330
[45] Date of Patent: Jun. 30, 1998

[54] SEMICONDUCTOR DEVICE AND METHOD FOR FABRICATING THE SAME

[75] Inventor: Chan Kwang Park, Ichon, Rep. of Korea

[73] Assignee: Hyundai Electronics Industries Co., Ltd., Kyoungki-do, Rep. of Korea

[21] Appl. No.: 670,167

[22] Filed: Jun. 27, 1996

[30] Foreign Application Priority Data

Jun. 30, 1995 [KR] Rep. of Korea ................... 95-18864

[51] Int. Cl.[6] ................................................ H01L 21/84
[52] U.S. Cl. .................... 438/164; 438/406; 438/412; 438/455; 438/459
[58] Field of Search .................... 438/164, 406, 438/412, 455, 459, 222

[56] References Cited

U.S. PATENT DOCUMENTS

| | | |
|---|---|---|
| 4,263,709 | 4/1981 | Weitzel et al. ........................ 438/164 |
| 5,008,723 | 4/1991 | van der Have . |
| 5,023,197 | 6/1991 | Haond et al. ......................... 438/164 |
| 5,162,882 | 11/1992 | Pollack . |
| 5,185,280 | 2/1993 | Houston et al. . |
| 5,482,871 | 1/1996 | Pollack .................................... 438/164 |
| 5,633,182 | 5/1997 | Miyawaki et al. .................... 438/164 |

*Primary Examiner*—John Niebling
*Assistant Examiner*—Richard A. Booth
*Attorney, Agent, or Firm*—Gary M. Nath; Nath & Associates

[57] ABSTRACT

A semiconductor device and a method for fabricating the same, wherein a thick side wall oxide film or polysilicon film is formed on the edge portion of the second silicon substrate. At the side wall of the oxide film or polysilicon film, the thickness of an active semiconductor substrate at its edge portion increases, thereby obtaining an increased threshold voltage at the edge portion. That is, the formation of the side wall oxide film is carried out to prevent a gate oxide film of the semiconductor device from being directly formed on each side wall of the active silicon substrate. As a result, it is possible to prevent a degradation in electrical characteristic due to a degradation in threshold voltage caused by a reduced thickness of the active semiconductor substrate at its edge portion.

6 Claims, 4 Drawing Sheets

SEMICONDUCTOR DEVICE AND METHOD FOR FABRICATING THE SAME

BACKGROUND OF THE INVENTION

1. Field of the Invention

The present invention relates to a semiconductor device having a silicon-on-insulator (SOI) structure and a method for fabricating the same, and more particularly, to a method for fabricating a semiconductor device wherein a side wall oxide film or polysilicon layer is formed on the edge of an insulating film adapted to insulate the side wall of an active semiconductor substrate of the semiconductor device from a gate oxide film of the semiconductor device.

2. Description of the Prior Art

In the fabrication of semiconductor devices, formation of a SOI structure is involved to achieve an isolation between adjacent elements, thereby obtaining a superior electrical characteristic. Such a SOI structure is made by forming a silicon oxide film as an insulator on an under silicon substrate and forming another silicon substrate (to be used as an active substrate), for example, a single-crystalline silicon layer on the silicon oxide film.

Referring to FIGS. 1A and 1B, a conventional SOI structure is illustrated.

FIG. 1A is a view showing the layout of a metal oxide silicon field effect transistor (MOSFET) having the SOI structure. In FIG. 1A, respective positions of masks for an active region 1 and a gate electrode 2 on a silicon substrate (not shown) are shown.

FIG. 1B is a cross-sectional view taken along the line I—I of FIG. 1A. A silicon oxide film 4 is deposited over a silicon substrate 3. A second silicon substrate 5 having a trapezoidal cross-sectional structure is formed on the silicon oxide film 4. On a desired portion of the resulting structure, a gate oxide film 6 and a gate electrode 7 are sequentially formed.

As shown in FIG. 1B, the second silicon substrate 5 has an inclined structure in that its thickness at the edge of the active region is smaller than its thickness $d_{si}$ at the middle portion of the active region. Due to such a structure, the depth of the depletion region is limited to the thickness of the second silicon substrate 5. As a result, the charge $Q_b$ of depleted bulk is limited by the thickness of the second silicon substrate 5, thereby decreasing the threshold voltage of the semiconductor device, as expressed the following equations:

$$V_T = V_{FB} + Q_B / C_{OX} \quad (1)$$

$$C_{OX} = \epsilon_{OX} / t_{OX} \quad (2)$$

where, $V_T$ represents the threshold voltage, $V_{FB}$ the flat band voltage, $Q_B$ the bulk charge, $C_{OX}$ the capacitance of the oxide film, $\epsilon_{OX}$ the dielectric constant of the oxide film, and $t_{OX}$ the thickness of the gate oxide film.

Equation (1) shows that it is impossible to increase the threshold voltage at the lower edge portion 8 of the second silicon substrate 5 even when the impurity doping rate at that portion increases. This implies a difference in threshold voltage between the middle portion and edge portion of the second silicon substrate 5. The drain current characteristic thus involves a point of inflexion when it varies in accordance with a variation in gate voltage, as shown in FIG. 2. As a result, it is difficult to control the threshold voltage of the semiconductor device having the SOI structure. Furthermore, the characteristic of the SOI element depends on the edge shape of the second silicon substrate 5. This results in a great variation in the characteristics of the semiconductor device.

SUMMARY OF THE INVENTION

Therefore, an objective of the invention is to solve the above-mentioned problems and to provide a semiconductor device and a method for fabricating the same, wherein a thick side wall oxide film or polysilicon film is formed on the edge portion of the second silicon substrate, thereby increasing the threshold voltage at that portion.

In accordance with the aspect of the present invention, a semiconductor device having a silicon-on-insulator structure, compreses a first silicon substrate; a first silicon oxide film formed over the first silicon substrate; a second silicon substrate having a trapezoidal cross-sectional structure formed on the first silicon oxide film at an active region; a side wall insulating film formed on each side wall of the second silicon substrate; a gate oxide film formed on a desired portion of the second silicon substrate; a gate electrode formed over the gate oxide film; and source/drain impurity diffusion regions respectively defined in portions of the second substrate not overlapping with the gate electrode.

The side wall insulating film is made of a material doped with impurity ions having a conduction type opposite to that of the second silicon substrate. A doped region may be defined between the side wall of the second silicon substrate and the side wall insulating film. A side wall polysilicon layer may also be interposed between the side wall of the second silicon substrate and the side wall insulating film.

In accordance with another aspect of the present invention, a semiconductor device having a silicon-on-insulator structure, comprises a first silicon substrate; a first silicon oxide film formed over the first silicon substrate; a second silicon substrate having a trapezoidal cross-sectional structure formed on the first silicon oxide film at an active region; a side wall oxide film formed on each side wall of the second silicon substrate; a side wall polysilicon film formed on the side wall oxide film, the side wall polysilicon film having a conduction type opposite to that of the second silicon substrate; a gate oxide film formed on a desired portion of the second silicon substrate; a gate electrode formed over the gate oxide film; and source/drain impurity diffusion regions respectively defined in portions of the second substrate not overlapping with the gate electrode.

In accordance with another aspect of the present invention, a method for fabricating a semiconductor device having a silicon-on-insulator structure, comprises the steps of: depositing a first silicon oxide film over first silicon substrate and then depositing a silicon substrate layer over the first silicon oxide film; patterning the silicon substrate layer, thereby forming a second silicon substrate which has a trapezoidal cross-sectional structure and is disposed on the first silicon oxide film at an active region; forming a side wall insulating film doped with impurity ions having a conduction type different from that of the second silicon substrate on each side wall of the second silicon substrate; annealing the side wall insulating film in such a manner that the impurity ions doped in the side wall insulating film are diffused into the side wall of the second silicon substrate, thereby forming a doped region; sequentially forming a gate oxide film and a gate electrode on a desired portion of the second silicon substrate; and implanting impurity ions in a high concentration in portions of the second substrate not overlapping with the gate electrode, thereby forming source/drain impurity diffusion regions.

In accordance with another aspect of the present invention, a method for fabricating a semiconductor device having a silicon-on-insulator structure, comprises the steps of: depositing a first silicon oxide film over a first silicon substrate and then depositing a silicon substrate layer over the first silicon oxide film; patterning the silicon substrate layer, thereby forming a second silicon substrate which has a trapezoidal cross-sectional structure and is disposed on the first silicon oxide film at an active region; depositing an insulating film and a polysilicon layer doped with impurity ions over the resulting structure obtained after the formation of the second silicon substrate; anisotropically etching the polysilicon layer and the insulating film, thereby forming side wall oxide films and side wall polysilicon layers respectively formed on opposite side walls of the second silicon substrate; sequentially forming a gate oxide film and a gate electrode on a desired portion of the second silicon substrate; and implanting impurity ions in a high concentration in portions of the second substrate not overlapping with the gate electrode, thereby forming source/drain impurity diffusion regions.

The side wall polysilicon layers are made of a material doped with impurity ions having a conduction type opposite to that of the second silicon substrate. The step of depositing the doped polysilicon layer may be substituted by the steps of depositing an undoped polysilicon layer over the insulating film and then implanting impurity ions in the undoped polysilicon layer.

Since the side wall oxide film or side wall polysilicon layer is thickly formed on the edge of the second silicon substrate in accordance with the present invention, it is possible to obtain an increased threshold voltage at the edge of the second silicon substrate.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

FIGS. 3A to 3E and FIG. 4 illustrate a method for fabricating a MOSFET having a SOI structure according to a first embodiment of the present invention.

Figure 3A:
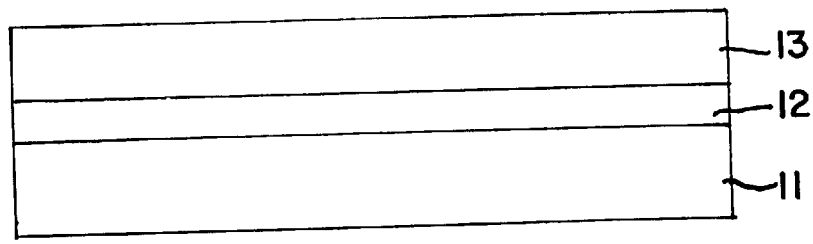
FIGS. 3A to 3E are sectional views respectively illustrating sequential steps of a method for fabricating a MOSFET having a SOI structure in accordance with a first embodiment of the present invention.

In accordance with this method, a first silicon substrate 11 is first prepared, and a first silicon oxide film 12 and a second silicon substrate 13 are sequentially formed, as shown in FIG. 3A.

Figure 1A:
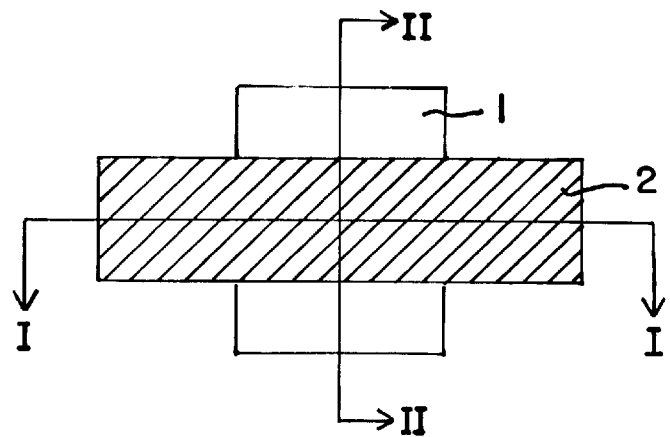
FIG. 1A is a view illustrating the layout of a MOSFET having a conventional SOI structure.
Figure 1B:
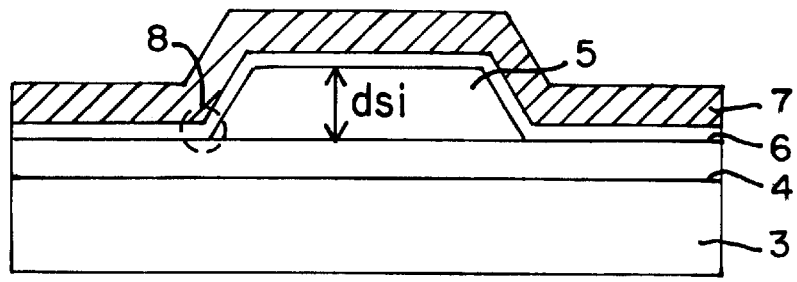
FIG. 1B is a cross-sectional view taken along the line I—I of FIG. 1A.
Figure 2:
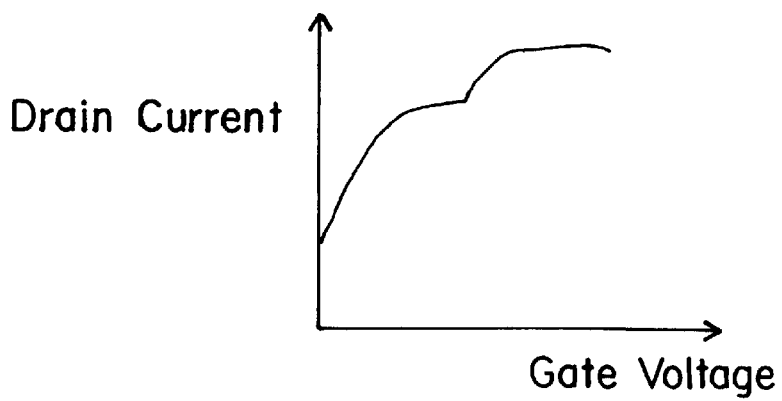
FIG. 2 is a graph illustrating an operating characteristic of the MOSFET having the conventional SOI structure.
Figure 3B:
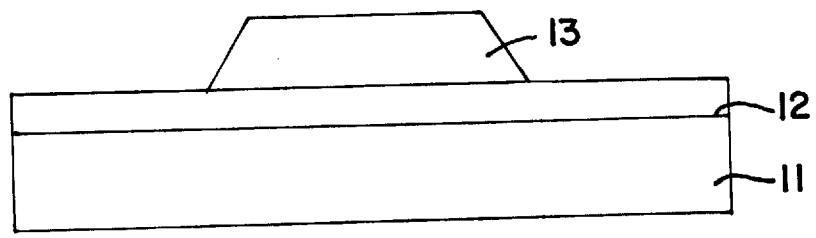

The second silicon substrate 13 is then anisotropically etched using a mask which may be the active region mask shown in FIG. 1A, so that it may have a trapezoidal pattern having inclined side walls as shown in FIG. 3B.

Figure 3C:
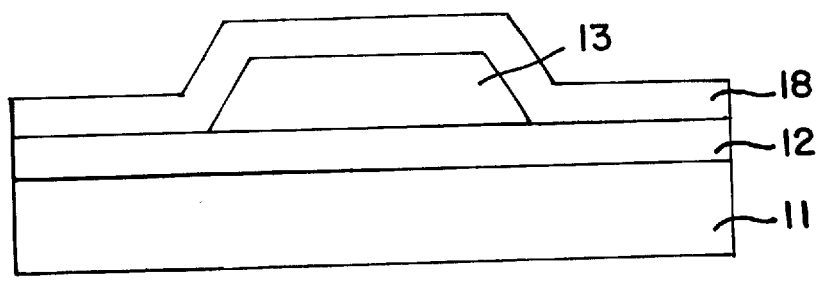

Over the resulting structure shown in FIG. 3B, a second silicon oxide film 18 is then deposited, as shown in FIG. 3C.

Figure 3D:
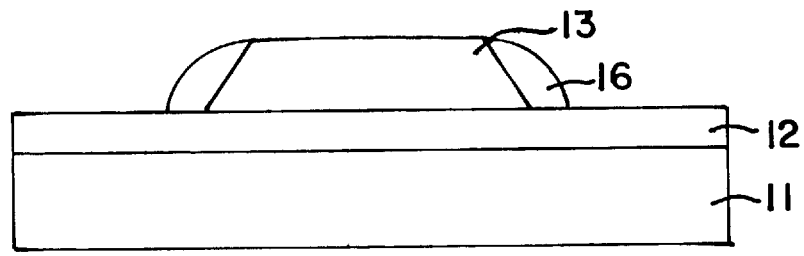

Thereafter, the second silicon oxide film 18 is anisotropically etched, thereby respectively forming side wall silicon oxide films 16 on the inclined side walls of the second silicon substrate 13 in order to achieve an increase in threshold voltage at the edge of each side wall of the second silicon substrate 12, as shown in FIG. 3D.

Figure 3E:
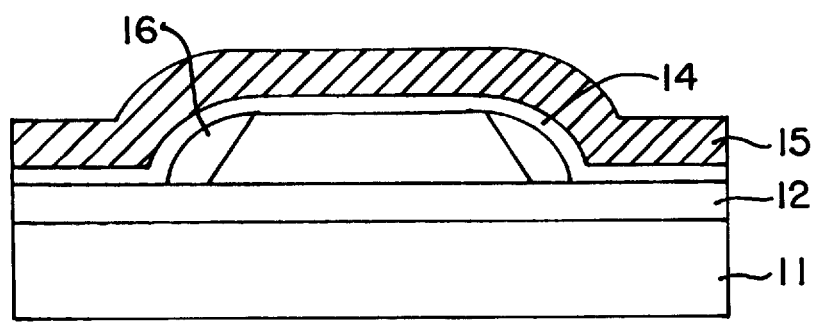

A gate oxide film 14 is then formed over a desired portion of the resulting structure, as shown in FIG. 3E. A gate electrode 15 is then formed over the gate oxide film 14.

Figure 4:
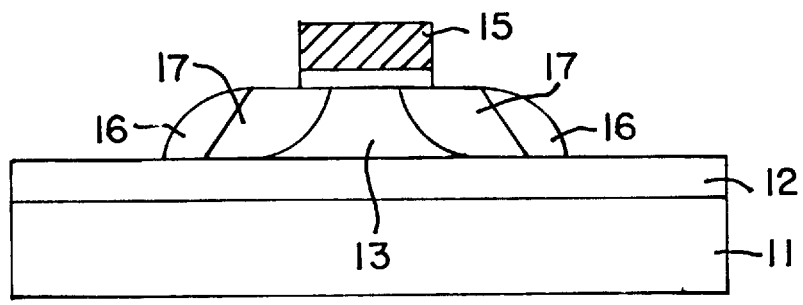
FIG. 4 is a cross-sectional view taken along the line II—II of FIG. 1, but illustrating the MOSFET fabricated in accordance with the method of FIGS. 3A to 3E.

Using the gate oxide film 14 and gate electrode 15 as a mask, impurity ions are implanted in a high concentration in a portion of the second silicon substrate 13 not overlapping with the gate electrode 15, thereby forming source/drain impurity diffusion regions 17 in the second silicon substrate 13. The resulting structure is shown in FIG. 4. FIG. 4 is a cross-sectional view taken along the line II—II of FIG. 1A whereas FIG. 3E is a cross-sectional view taken along the line I—I of FIG. 1A.

This structure has side wall films respectively on the edges of the second silicon substrate using an insulating film. Accordingly, it is possible to obtain an increased threshold voltage by increasing the thickness of the insulating film. This is apparent from the equation (2) (in the equation (2), $t_{OX}=c_{OX}\times\epsilon_{OX}$).

Figure 5:
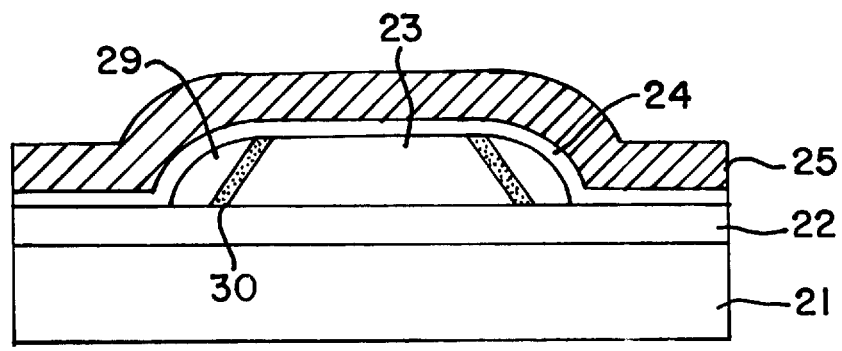
FIG. 5 is a view similar to FIG. 4 illustrating a MOSFET having a SOI structure according to a second embodiment of the present invention.

FIG. 5 illustrate a MOSFET having another SOI structure according to a second embodiment of the present invention.

As shown in FIG. 5, this structure is formed by first depositing a first silicon oxide film 22 over the first silicon substrate 21. A second silicon substrate 23 having a trapezoidal cross-sectional structure is then formed on the first silicon oxide film 22. Using a material such as phosphosilicate glass (PSG) or boro-silicate glass (BSG), a side wall insulating film 29 is then formed on each side wall of the second silicon substrate 23. In order to obtain an increased threshold voltage at the edge of the second silicon substrate 23, the side wall insulating film 29 is annealed at a temperature ranging from 800° C. to 1,100° C. By the annealing, the impurity ions contained in the side wall insulating film 29 are diffused into the side walls of the second silicon substrate 23, thereby forming doped regions 30 respectively extending to a desired depth along the side walls of the second silicon substrate 23. A gate oxide film 24 is then formed over a desired portion of the resulting structure. A gate electrode 25 is then formed over the gate oxide film 24.

In accordance with this embodiment, the side wall insulating film 29 has a conduction type opposite to that of the second silicon substrate 23. The annealing step may be carried out simultaneously with an annealing step for source/drain impurity diffusion regions after the formation of the gate electrode 25.

Figure 6:
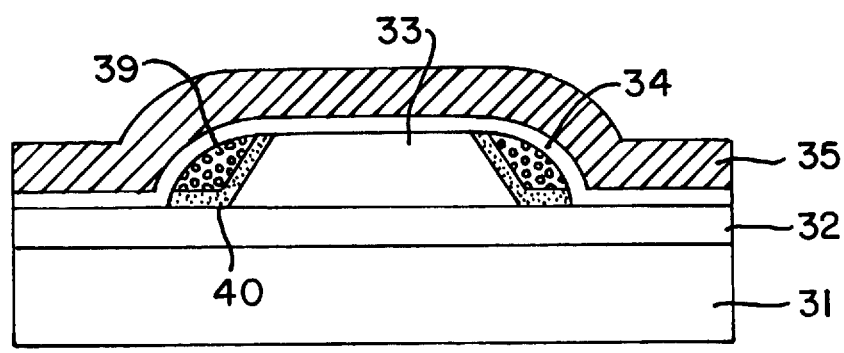
FIG. 6 is a view similar to FIG. 4 illustrating a MOSFET having a SOI structure according to a third embodiment of the present invention.

On the other hand, FIG. 6 illustrate a MOSFET having another SOI structure according to a third embodiment of the present invention.

As shown in FIG. 6, this structure is formed by first depositing a first silicon oxide film 32 over the first silicon substrate 31. A second silicon substrate 33 having a trapezoidal cross-sectional structure is then formed on the first silicon oxide film 32. Thereafter, an oxide film and a polysilicon layer doped with impurity ions having a conduction type opposite to that of the second silicon substrate 33 are then sequentially deposited over the second silicon substrate 33. Subsequently, the oxide film and polysilicon layer are anisotropically etched in such a manner that they are left only on both side walls of the second silicon substrate 33. As a result, side wall oxide films 40 and side wall polysilicon layers 39 are formed on both side walls of the second silicon substrate 33, respectively. A gate oxide film 34 is then formed over a desired portion of the resulting structure. A gate electrode 35 is then formed over the gate oxide film 34.

In place of the doped polysilicon layer, an undoped polysilicon layer may be used. In this case, the undoped polysilicon layer will be subsequently doped with impurity ions.

As apparent from the above description, a side wall oxide film or side wall polysilicon layer is thickly formed on the edge of the second silicon substrate in accordance with the present invention. Accordingly, it is possible to obtain an increased threshold voltage at the edge of the second silicon substrate. In other words, the formation of the side wall oxide film is carried out to prevent the gate oxide film from being directly formed on each side wall of the second silicon substrate. As a result, it is possible to prevent a degradation in electrical characteristic due to a degradation in threshold voltage.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor device having a silicon-on-insulator structure, comprising the steps of:

depositing a first silicon oxide film over a first silicon substrate and then depositing a silicon substrate layer over the first silicon oxide film;

patterning the silicon substrate layer, thereby forming a second silicon substrate which has a trapezoidal cross-sectional structure and is disposed on the first silicon oxide film at an active region;

forming a side wall insulating film doped with impurity ions having a conduction type different from that of the second silicon substrate on each side wall of the second silicon substrate;

forming a doped region in the side wall insulating film in such a manner that the impurity ions doped in the side wall insulating film are diffused into the side wall of the second silicon substrate;

sequentially forming a gate oxide film and a gate electrode on a portion of the second silicon substrate; and implanting impurity ions in a high concentration in portions of the second substrate not overlapping with the gate electrode, thereby forming source/drain impurity diffusion regions.

2. The method in accordance with claim 1, wherein the forming the doped region step comprises annealing and is performed at a temperature ranging from 800° C. to 1,100° C.

3. The method in accordance with claim 1, wherein the doped region is formed by diffusing the impurity ions doped in the side wall insulating film into the side wall of the second silicon substrate by a subsequent high-temperature treatment required in the formation of the source/drain impurity diffusion regions.

4. A method for fabricating a semiconductor device having a silicon-on-insulator structure, comprising the steps of:

depositing a first silicon oxide film over a first silicon substrate and then depositing a silicon substrate layer over the first silicon oxide film;

patterning the silicon substrate layer, thereby forming a second silicon substrate which has a trapezoidal cross-sectional structure and is disposed on the first silicon oxide film at an active region;

depositing an insulating film and a polysilicon layer doped with impurity ions over the resulting structure obtained after the formation of the second silicon substrate;

anisotropically etching the polysilicon layer and the insulating film, thereby forming side wall oxide films and side wall polysilicon layers respectively formed on opposite side walls of the second silicon substrate;

sequentially forming a gate oxide film and a gate electrode on a portion of the second silicon substrate; and implanting impurity ions in a high concentration in portions of the second substrate not overlapping with the gate electrode, thereby forming source/drain impurity diffusion regions.

5. The method in accordance with claim 4, wherein the side wall polysilicon layers are made of a material doped with impurity ions having a conduction type opposite to that of the second silicon substrate.

6. A method for fabricating a semiconductor device having a silicon-on-insulator structure, comprising the steps of:

depositing a first silicon oxide film over a first silicon substrate and then depositing a silicon substrate layer over the first silicon oxide film;

patterning the silicon substrate layer, thereby forming a second silicon substrate which has a trapezoidal cross-sectional structure and is disposed on the first silicon oxide film at an active region;

depositing an insulating film and an undoped polysilicon layer over the resulting structure obtained after the formation of the second silicon substrate and then implanting impuirty ions into the undoped polysilicon layer;

anisotropically etching the polysilicon layer and the insulating film, thereby forming side wall oxide films and side wall polysilicon layers respectively formed on opposite side walls of the second silicon substrate;

sequentially forming a gate oxide film and a gate electrode on a portion of the second silicon substrate; and implanting impurity ions in a high concentration in portions of the substrate not overlapping with the gate electrode, thereby forming source/drain impurity regions.

* * * * *

UNITED STATES PATENT AND TRADEMARK OFFICE
CERTIFICATE OF CORRECTION

PATENT NO. : 5,773,330
DATED : June 30, 1998
INVENTOR(S) : PARK

It is certified that error appears in the above-identified patent and that said Letters Patent is hereby corrected as shown below:

In the Claims:

Please amend claim 6 as follows:
    Column 6,

Claim 6, line 48, replace "into" with --in--.

Claim 6, line 58, after "of the" insert --second--.

Signed and Sealed this

Thirteenth Day of October 1998

Attest:

BRUCE LEHMAN

*Attesting Officer*         *Commissioner of Patents and Trademarks*